(12) United States Patent
Li (10) Patent No.: US 7,875,970 B2
(45) Date of Patent: Jan. 25, 2011

(54) INTEGRATED CIRCUIT PACKAGE HAVING A CASTELLATED HEATSPREADER

(75) Inventor: Tung Lok Li, Hong Kong (HK)

(73) Assignee: Green Arrow Asia Limited, Hong Kong SAR (CN)

( * ) Notice: Subject to any disclaimer, the term of this patent is extended or adjusted under 35 U.S.C. 154(b) by 0 days.

(21) Appl. No.: 12/512,009

(22) Filed: Jul. 29, 2009

(65) Prior Publication Data

US 2010/0314743 A1 Dec. 16, 2010

Related U.S. Application Data

(60) Provisional application No. 61/185,970, filed on Jun. 10, 2009.

(51) Int. Cl.
*H01L 23/367* (2006.01)

(52) U.S. Cl. ............................... 257/706; 257/E21.506

(58) Field of Classification Search ................. 257/706, 257/712, 676, E21.506
See application file for complete search history.

(56) References Cited

U.S. PATENT DOCUMENTS

| | | | |
|---|---|---|---|
| 6,114,190 A | 9/2000 | Brand | |
| 6,849,942 B2 * | 2/2005 | Lin et al. | 257/712 |
| 7,045,395 B2 * | 5/2006 | Lo et al. | 438/122 |
| 7,053,482 B2 | 5/2006 | Cho | |
| 7,053,482 B2 * | 5/2006 | Cho | 257/704 |
| 7,133,287 B2 * | 11/2006 | Campini et al. | 361/719 |
| 7,378,300 B2 | 5/2008 | Marimuthu et al. | |
| 7,498,664 B2 * | 3/2009 | Ito et al. | 257/659 |
| 7,608,915 B2 * | 10/2009 | Liao et al. | 257/675 |
| 2006/0261467 A1 * | 11/2006 | Colgan et al. | 257/707 |
| 2007/0122943 A1 | 5/2007 | Foong et al. | |
| 2007/0181997 A1 * | 8/2007 | Ahr et al. | 257/712 |
| 2007/0200225 A1 * | 8/2007 | Ibrahim et al. | 257/712 |
| 2008/0157345 A1 * | 7/2008 | Lu et al. | 257/712 |
| 2008/0258278 A1 | 10/2008 | Ramos et al. | |
| 2009/0127700 A1 * | 5/2009 | Romig | 257/712 |
| 2009/0230544 A1 * | 9/2009 | Wang et al. | 257/712 |

\* cited by examiner

*Primary Examiner*—Nathan W Ha
(74) *Attorney, Agent, or Firm*—Eagle IP Limited; Jacqueline C. Lui (57) ABSTRACT

In one aspect, an embodiment of an IC package includes an IC chip electrically connected to a substrate, a heatspreader disposed over the IC chip, wherein the heatspreader does not directly contact the IC chip, and an encapsulant material encapsulating at least a portion of the IC chip and a portion of the heatspreader such that a top portion of the heatspreader is exposed to the surroundings of the IC package. In another embodiment, the heatspreader comprises at least one castellation to improve adhesion to the encapsulation compound. A method of manufacturing such IC package is also disclosed.

18 Claims, 6 Drawing Sheets

FIG. 8B

INTEGRATED CIRCUIT PACKAGE HAVING A CASTELLATED HEATSPREADER

CROSS REFERENCE TO RELATED APPLICATIONS

This application claims benefit under 35 U.S.C. §119(e) of U.S. Provisional Application having Ser. No. 61/185,970 filed on Jun. 10, 2009, the entirety of which is enclosed herewith by reference.

FIELD OF INVENTION

This invention relates generally to integrated circuit (IC) packaging technology and, in particular to IC packages having enhanced heat dissipation and related methods of manufacture.

BACKGROUND OF INVENTION

IC packaging is one of the final stages involved in the fabrication of IC devices. During IC packaging, one or more IC chips are mounted on a package substrate, connected to electrical contacts, and then coated with an encapsulation material comprising an electrical insulator such as epoxy or silicone molding compound. The resulting structure, commonly known as an "IC package," may then be mounted onto a printed circuit board (PCB) and/or connected to other electrical components. In most IC packages, the IC chip is completely covered by the encapsulation material, while the electrical contacts are at least partially exposed so that they can be connected to other electrical components.

IC chips generate a great deal of heat during normal operation. As the speed of the IC chips has increased, so too has the amount of heat generated by them. It is desirable to dissipate this heat from an IC package in an efficient manner.

SUMMARY OF INVENTION

The present invention relates to IC packages having enhanced heat dissipation and related methods of manufacturing. More particularly, in one aspect, the invention features an IC package with an IC chip electrically connected to a substrate and a heatspreader disposed over the IC chip, wherein the heatspreader does not directly contact the IC chip. In some embodiments, the heatspreader may have a castellated texture on a bottom side thereof for enhanced adhesion with the encapsulation material and increased heat dissipation.

In one embodiment, the IC package comprises a leadframe having a first surface and an opposing second surface. A first surface of an IC chip is mounted on the first surface of the leadframe. An encapsulation embeds the first surface of leadframe and a second surface of the IC chip at a first side. A heat sink comprising a base sheet and at least one castellation is disposed on top of the leadframe. The castellation extends from a first surface of the base sheet and they are all embedded in a second side of the encapsulation. A second surface of the base sheet is exposed to the environment.

In another embodiment, the IC package further comprises a central castellation that extends from the first surface of the base sheet. A center of the central castellation is aligned to a center of the IC chip to minimize the distance between the heat sink and the IC chip to improve heat dissipation performance.

In another embodiment of the present invention, the IC package further comprises a metal clip on at least one side that clamps the second surface of the base sheet and the surface opposing that. The metal clip further prevents the second leadframe from detaching and also improves heat dissipation performance of the IC package by directly contacting the PCB when the leadframe is soldered to the PCB, such that heat can be transferred from the heat sink to the PCB so it can be spread away even faster.

According to another aspect of the present invention, a method of manufacturing the IC package as described above is disclosed. The method comprises the steps of etching a leadframe strip to define a leadframe having a first surface and an opposing second surface, mounting a second surface of an IC chip on the first surface of the leadframe, and fixing the leadframe and a heat sink strip in a mold, such that the heat sink strip is disposed in close proximity to the IC chip and a cavity exists therebetween. The cavity is then encapsulated by an encapsulation compound such that the first surface of the leadframe strip and the second surface of the IC chip are embedded in one side of the encapsulation and the heat sink strip is embedded in an opposing side of the encapsulation. The IC package is then singulated from the leadframe strip, the heat sink strip and the encapsulation.

In one embodiment, the method further comprises a step of etching a first surface of the heat sink strip to define at least one castellation.

In another embodiment, the method further comprises a step of attaching a metal clip to at least one side of the IC package.

There are many advantages to the present invention. A heat sink with castellations greatly increases the surface area of contact between the heat sink and the encapsulation. As a result, the adhesion of the heat sink to the encapsulation is increased.

In this invention, a thin layer of encapsulation separates the heat sink from the IC chip, preventing them to be in direct contact. This reduces the chance that the IC chip will be damaged during the fabrication process, and also prevents short circuiting the IC chip and the heat sink. A surface of the heat sink is further exposed to the external environment of the IC package to improve heat dissipation to the environment.

If the castellations are etched from the heat sink strip, the etching process produces undercuts at the side surfaces of the castellations. By being concavely curved, the undercuts further increases the amount of surface area of contact between the heat sink and the encapsulation. The undercuts also provide better interlocking between the heat sink and the encapsulation to further decrease the chance of detaching.

The central castellation is aligned to the IC chip, with a thin layer of encapsulation separating the two. That way, the distance between the two is minimized regardless of the package thickness while still preventing the two to be in direct contact.

DETAILED DESCRIPTION OF THE PREFERRED EMBODIMENTS

Various embodiments of the present invention will now be described more fully with reference to the accompanying drawings. The invention may, however, be embodied in many different forms and should not be construed as limited to the embodiments set forth herein; rather, the embodiments are provided so that this disclosure will be thorough and complete, and will fully convey the scope of the invention to those skilled in the art.

Throughout the specification and claims, the terms "IC chip" and "semiconductor die" are used interchangeably. The same applies to the terms "heatspreader" and "heat sink".

Figure 1:
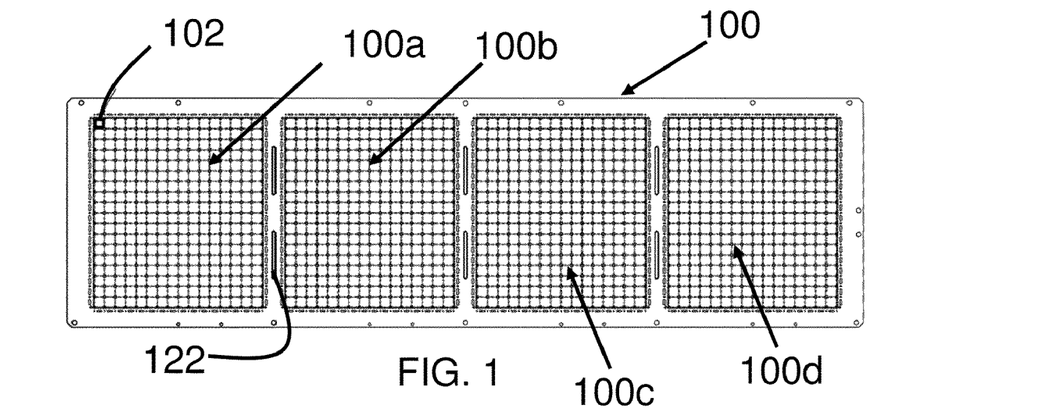
FIG. 1 is a top view of a leadframe strip according to an embodiment of the present invention.

Referring now to FIG. 1, an embodiment of a leadframe strip 100 used in an IC package manufacturing process is shown having a pattern etched on a top surface thereof. In various embodiments, the leadframe strip 100 is made of either a rigid material, such as, for example, BT, FR4, or ceramic, or a flexible material, such as, for example, polymide, or is formed of a metal, such as for example, copper or copper alloy, aluminum or aluminum alloy, or other metal or metal alloy. In the embodiment shown, the leadframe strip 100 comprises four leadframe matrices 100a-100d, each matrix being subdivided into a plurality of leadframes 102. As described in more detail below, each leadframe 102 (288 shown) of the leadframe strip 100 may be used to form an individual IC package. The leadframe strip 100 also has a plurality of guides 122 disposed around a periphery thereof and/or interposed between the matrices 100a-d thereof. As will be explained in more detail below, in various embodiments, the guides 122 are used as reference points when lining up the leadframe strip 100. While the leadframe strip 100 shown in FIG. 1 comprises a 4×1 leadframe matrix of 16×18 leadframes, any size, arrangement, and number of matrices and/or leadframes 102 may be utilized. FIG. 1 therefore, is an exemplary arrangement of one embodiment.

Figure 2A:
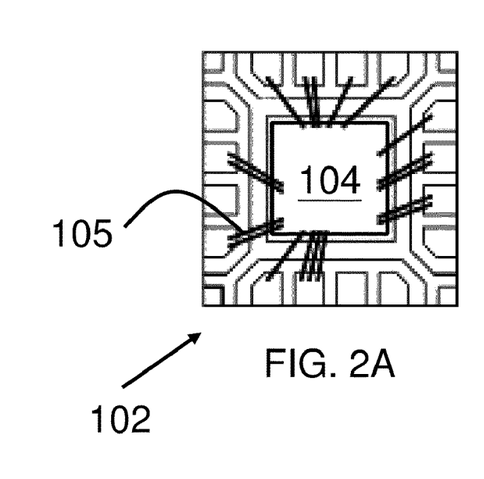
FIG. 2A is a top view of a leadframe according to an embodiment of the present invention.
Figure 2B:
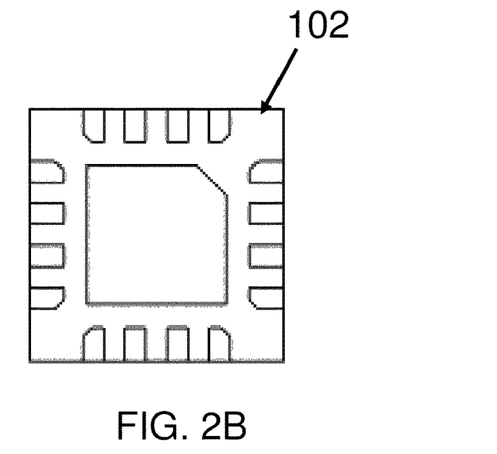
FIG. 2B is a bottom view of the leadframe in FIG. 2A.
Figure 2C:
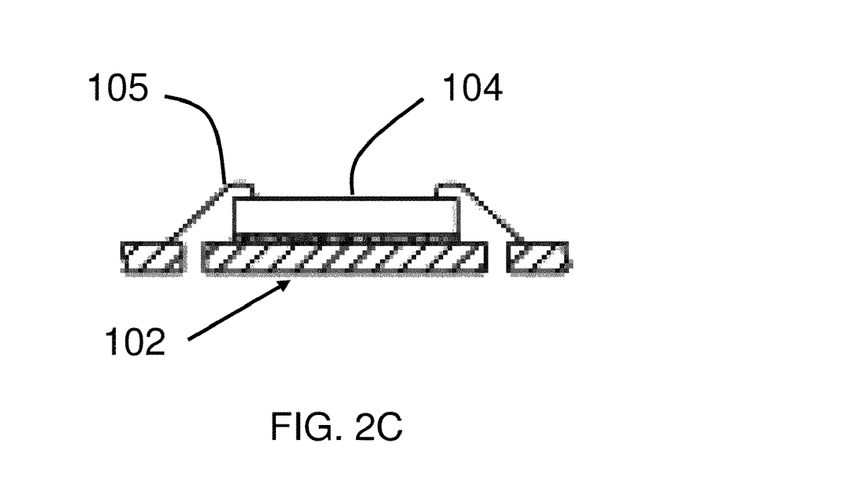
FIG. 2C is a horizontal cross sectional view of the leadframe in FIG. 2A.

Referring now to FIGS. 2A-2C, one of the leadframe 102 is shown. From this view, it can be seen that an IC chip 104 may be mounted to a central region of the leadframe 102 and wire bonded to the leadframe 102 via wire bonds 105.

Figure 3:
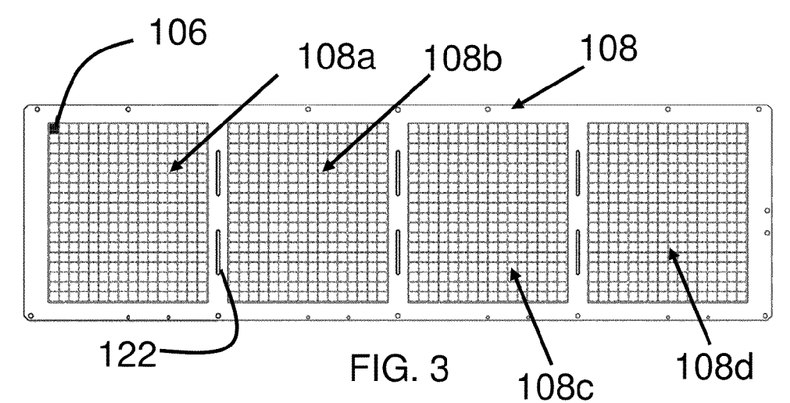
FIG. 3 is a top view of a heatspreader strip according to an embodiment of the present invention.

Referring now to FIG. 3, an embodiment of a heatspreader strip 108 is shown having a layout similar to the leadframe strip 100 of FIG. 1. In the embodiment shown, the heatspreader strip 108 is a strip having four heatspreader matrices 108a-108d, each matrix being subdivided into a plurality of heatspreaders 106. As will be described in more detail below, in various embodiments, the arrangement of the plurality of heatspreaders 106 of the heatspreader strip 108 corresponds to the arrangement of the plurality of leadframes 102 of the leadframe strip 100. In the embodiment shown, a plurality of guides 122 is disposed around the heatspreader strip 108 and/or between the matrices 108a-108d. In some embodiments, the guides 122 of the heatspreader strip 108 correspond to the guides 122 of the leadframe strip 100 to facilitate lining up of the heatspreader strip 108 and the leadframe strip 100.

Figure 4A:
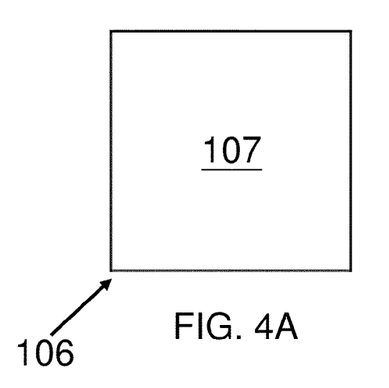
FIG. 4A is a top view of a heatspreader according to an embodiment of the present invention.
Figure 4B:
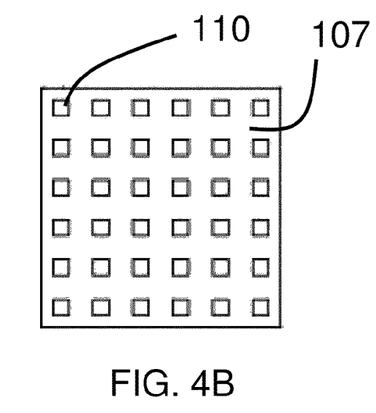
FIG. 4B is a bottom view of the heatspreader in FIG. 4A.
Figure 4C:
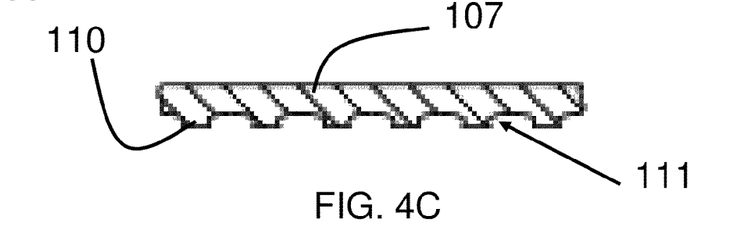
FIG. 4C is a horizontal cross sectional view of the heatspreader in FIG. 4A.

FIGS. 4A-4C show an embodiment of a heatspreader 106 of the heatspreader strip 108. Referring now to FIG. 4A in particular, a heatspreader 106 of an embodiment of a heatspreader strip 108 comprises a base sheet 107 having a generally flat or untextured top surface and a bottom surface, with at least one castellations (also called crenellations) 110 extending from the bottom surface of the base sheet 107. In various embodiments, the castellations 110 are formed by removing portions of the bottom surface of the heatspreader 106, such as, for example, via an etching process. In various embodiments, the castellations 110 are formed by selectively layering or adding material onto the bottom surface of the base sheet 107. In the embodiment shown, the castellations 110 are shown as generally cuboidal and uniformly disposed on the bottom surface of the base sheet 107. In various embodiments, the castellations 110 are of varying sizes and shapes and are disposed on the bottom surface in a variety of patterns. In various embodiments, the heatspreader 106 is a metal sheet, such as a copper sheet, having a thickness of on the order of 10 mils (approximately 250 microns). Recesses are then etched into a surface of the heatspreader 106 such that the castellations 110 would extend outwardly from the recesses In one embodiment, a generally concave undercut 111 is etched into at least one side surface of the castellations 110, such that the area at the bottom surface of the castellations 110 is larger than the cross-sectional area at the middle of the castellations.

Having the castellations 110 extending from the base sheet 107 as opposed to the bottom surface being a flat surface greatly improves the adhesion and attachment of the heatspreader 106 to an encapsulation compound which embeds the bottom surface of the heatspreader 106. In this invention, the contact area between the heatspreader 106 and the encapsulation compound is substantially increased over the traditional flat heat sinks. Also, the castellations 110 extending into the encapsulation compound means that the heatspreader 106 is able to withstand a larger shear force from the side as the castellations 110 interlocks with the encapsulation compound in the horizontal plane, while traditional flat heat sinks can only rely on adhesion force to keep the heat sink from moving sideways.

Figure 4D:
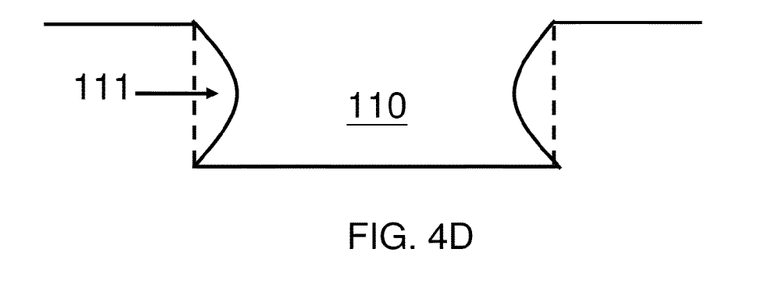
FIG. 4D is a side view of a castellation according to an embodiment of the present invention.

A side view of a castellation 110 is shown in FIG. 4D. The concave undercuts 111 that are etched into the side surfaces of the castellations 110 increase the surface area of the castellations 110 compared to flat side surfaces (shown in dashed lines), thus improving the adhesion of the heatspreader 106 to the encapsulant. The undercuts 111 also improves the physical interlocking performance of the heatspreader 106 to the encapsulant because the encapsulant fills up the undercuts 111 such that an area directly above the bottom surface of the castellation 110 is filled, thus preventing the castellations 110 from moving directly upwards after molding.

Figures 5A, 5B, 5C, 6A, 6B:
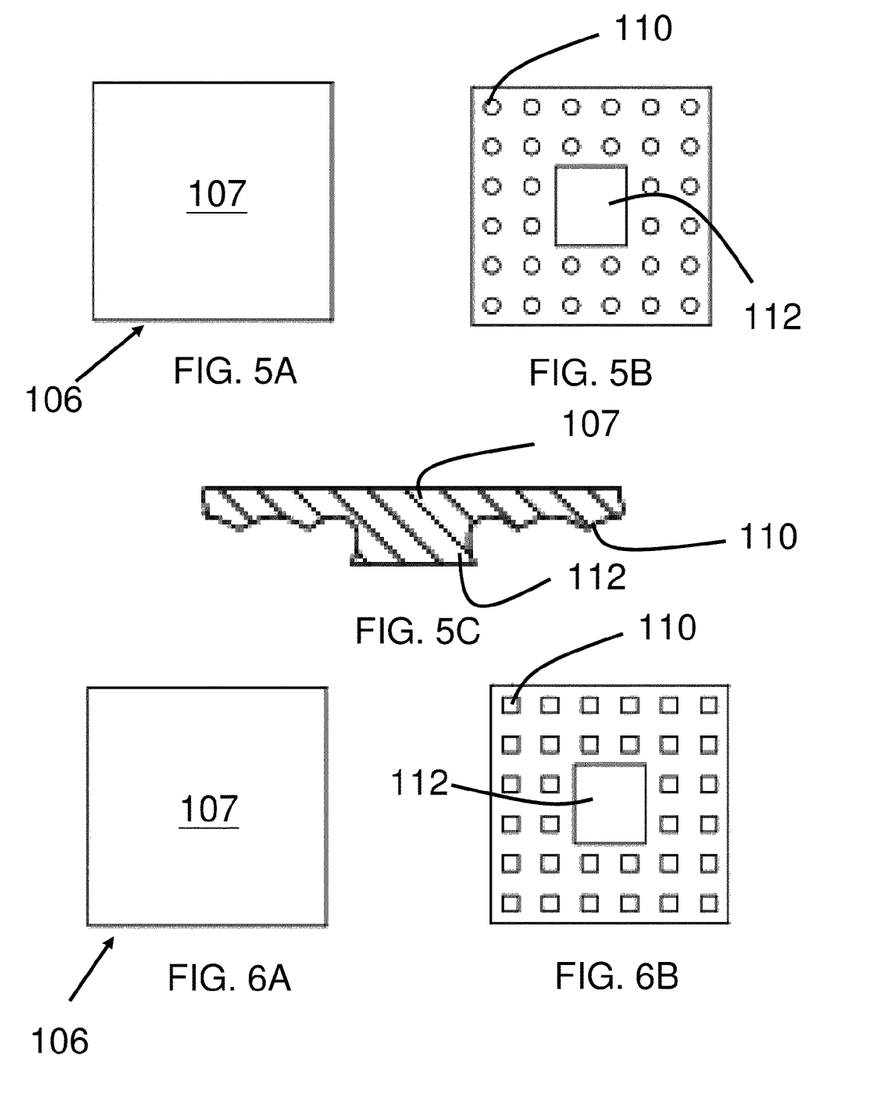
FIG. 5A is a top view of a heatspreader according to another embodiment of the present invention.
FIG. 5B is a bottom view of the heatspreader in FIG. 5A.
FIG. 5C is a horizontal cross sectional view of the heatspreader in FIG. 5A.
FIG. 6A is a top view of a heatspreader according to another embodiment of the present invention.
FIG. 6B is a bottom view of the heatspreader in FIG. 6A.

Referring now to FIGS. 5A-5C, a heatspreader 106 of an embodiment of the heatspreader strip 108 is shown having a central castellation 112 and a plurality of castellations 110 disposed around a periphery of the base sheet 107 where the central castellation 112 is bigger than the castellations 110 at the periphery. As can be seen from the side cross sectional view of FIG. 5B, in various embodiments, the central castellation 112 extends out farther from the base sheet 107 than the castellations 110. In the embodiment shown, the central castellation 112 and the castellations 110 disposed thereabout are integrally formed from the heatspreader strip 108. For example, portions of the heatspreader 106 may be etched away around the central castellation 112 so that the central castellation 112 is thicker than those castellations 110 disposed around the periphery as shown in FIG. 5C. As will be explained in more detail below, enhanced heat dissipation may be obtained when a central castellation 112 extends outwardly from the base sheet 107.

In thin IC packages, heat generated from the IC chip 104 only needs to travel for a short distance to reach the environment through the base sheet 107. However, as the IC packages get thicker, the distance between the IC chip 104 and the base sheet 107 also increases. If a central castellation 112 is absent, heat will need to travel through a thick layer of encapsulation compound before reaching the base sheet 107. With the central castellation 112, the thickness of the encapsulation compound between the heatspreader 106 and the IC chip 104 can be kept to a minimum. As the central castellation 112 is made of a thermally conductive material with thermal properties superior to the encapsulation compound, heat dissipation performance for the IC package is increased.

Figure 6C:
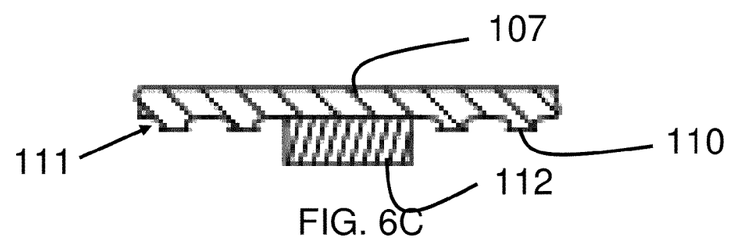
FIG. 6C is a horizontal cross sectional view of the heatspreader in FIG. 6A.

Referring now to FIGS. 6A-6C, a heatspreader 106 of an embodiment of the heatspreader strip 108 is shown having a plurality of castellations 110 disposed around a periphery of a bottom surface of the base sheet 107 and a central castellation 112 where, in some embodiments, the central castellation 112 is larger than the plurality of castellations 110. As can be seen from the side cross sectional view, the centrally disposed castellation 112 is attached to the base sheet 107. In various embodiments, the heatspreader 106 is formed of, for example, a metal such as copper and the central castellation 112 is formed of the same metal or is formed of a different metal. In various embodiments, the central castellation 112 is attached to the base sheet 107 via bonding, welding, epoxy, riveted, clipped, or other attachment method. One advantage of attaching one or more of the castellations 110 and/or central castellation 112 is that less material is wasted in the etching away process.

The main difference between this embodiment and the one shown in FIGS. 5A-5C is that the central castellation 112 is attached rather than etched. When the whole heatspreader 106 is formed by etching, the initial thickness of the heatspreader strip 108 will be large since it must be at least as thick as the base sheet 107 and the central castellation 112 combined. Heatspreader strip material is then etched away to form the castellations 110 and the central castellation 112. In this embodiment, the heatspreader strip 108 can be much thinner, with the thickness of the attached central castellation 112 chosen to keep the heatspreader 106 as close to the IC chip 104 as possible.

Having an attached central castellation 112 also makes it easy for the heatspreader 106 to adapt to different IC package thicknesses. In the previous embodiment, in order to keep the layer of encapsulation between the IC chip 104 and the central castellation 112 to be thin, heatspreaders 106 etched from heatspreader strips 108 will need to be of different thicknesses. In this embodiment, the same configuration and thickness of base sheet 107 and the castellations 110 can be used for IC package of all thicknesses, as the thickness of the central castellation 112 can be changed independently to the base sheet 107 to adapt to different IC package thicknesses.

Figure 7A:
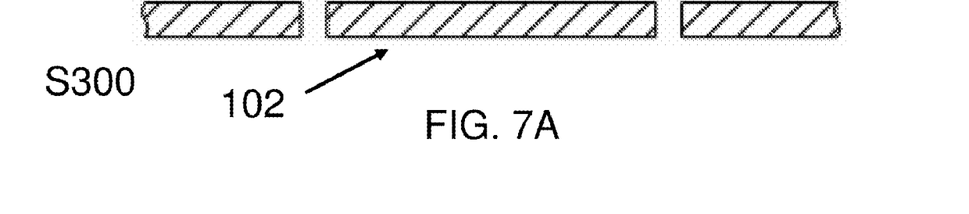
FIGS. 7A to 7F are a process flow chart of a method of fabricating an IC package 110 according to an embodiment of the present invention.
Figure 7B:
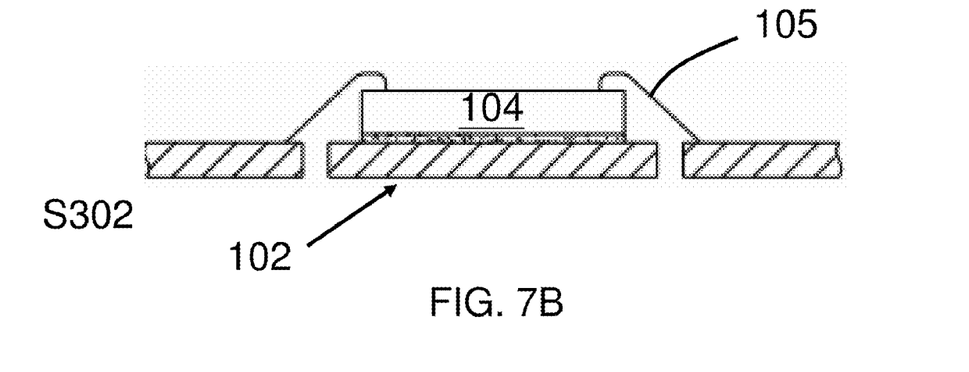
Figure 7C:
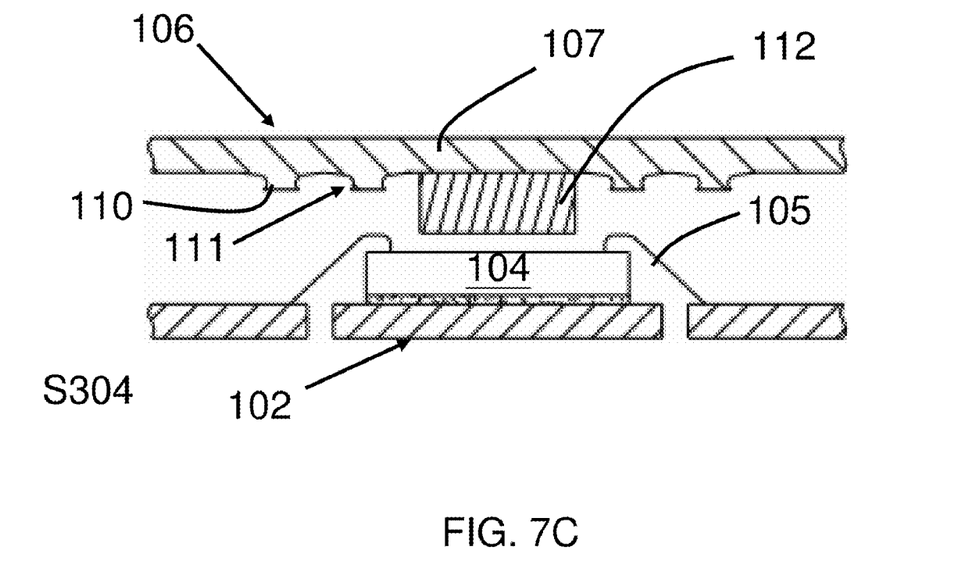

Referring now to FIGS. 7A-7F, the steps of a manufacturing process for forming an IC package having a heatspreader are illustrated. In step S300 as shown in FIG. 7A, a pattern is etched on a leadframe 102 of a leadframe strip 100. In the embodiment shown, the leadframe 102 has been etched all the way through. In various embodiments, the leadframe 102 is partially etched. In step S302 as shown in FIG. 7B, an IC chip 104 has been attached to the leadframe 102 and electrically coupled thereto via wire bonds 105. In step S304 as shown in FIG. 7C, a heatspreader 106 of a heatspreader strip 108 aligned over the leadframe strip 100 and positioned such that the central castellation 112 is disposed directly over the IC chip 104. In various embodiments, the central castellation 112 does not directly contact the IC chip 104. In some embodiments, there is a gap between a bottom surface of the central castellation 112 and the IC chip 104. As can be seen, the central castellation 112 is formed such that when the central castellation 112 is disposed directly above the IC chip 104, the wire bonds 105 coupled to the IC chip 104 do not touch the central castellation 112. In various embodiments, this is accomplished by increasing the gap between the IC chip 104 and the castellation 112 and/or decreasing the width of the central castellation 112 relative to the width of the IC chip 104. In various embodiments, the leadframe strip 100 is secured in place by a lower-half mold base and the heatspreader strip 108 is secured in place by an upper-half mold base. The leadframe strip 100 and the heatspreader strip 108 is aligned, for example, by using guides 122 (shown in FIGS. 1 and 3). In some embodiments, the heatspreader strip 108 is held in place in the upper-half mold base by vacuum suction, clipping, screwing, rotatable tabs, or other way of securing the heatspreader strip 108 in place. As can be seen in the figure, when the heatspreader strip 108 is disposed over the leadframe strip 100, a cavity is formed therebetween.

Figure 7D:
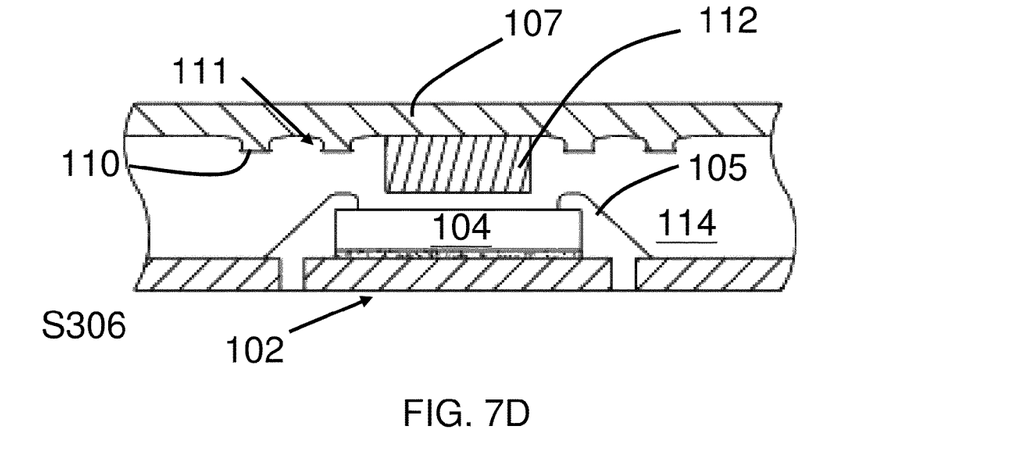
Figure 7E:
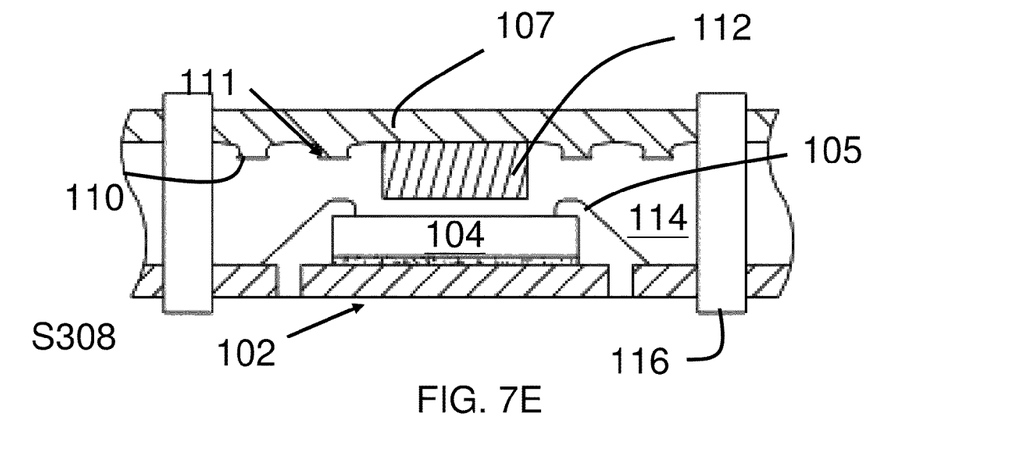

At step S306 as shown in FIG. 7D, an encapsulation compound 114 is interposed between the heatspreader strip 108 and the leadframe strip 100. In various embodiments, the encapsulation compound 114 is injected into the cavity between the heatspreader strip 108 and the leadframe strip 100 using a variety of known methods. As can be seen, the encapsulation compound 114 does not cover a top surface of the heatspreader strip 108. In such embodiments, not covering the heatspreader strip 108 enhances heat dissipation from a top surface thereof. In the embodiment shown, the plurality of castellations 110 on a bottom surface of the heatspreader 108 have undercuts 111 etched into sides thereof. In such embodiments, the undercuts 111 increase adhesion between the heatspreader strip 108 and the encapsulation compound 114 as explained above. At step S308 as shown in FIG. 7E, the leadframe strip 100 and the heatspreader strip 108 are singulated at singulation points 116 to separate a single IC package 118 from the rest of the IC packages formed from the leadframe strip 100 (shown in FIG. 1) and the heatspreader strip 108 (shown in FIG. 3). In step S310 as shown in FIG. 7F, a single IC package 118 is shown.

Figure 7F:
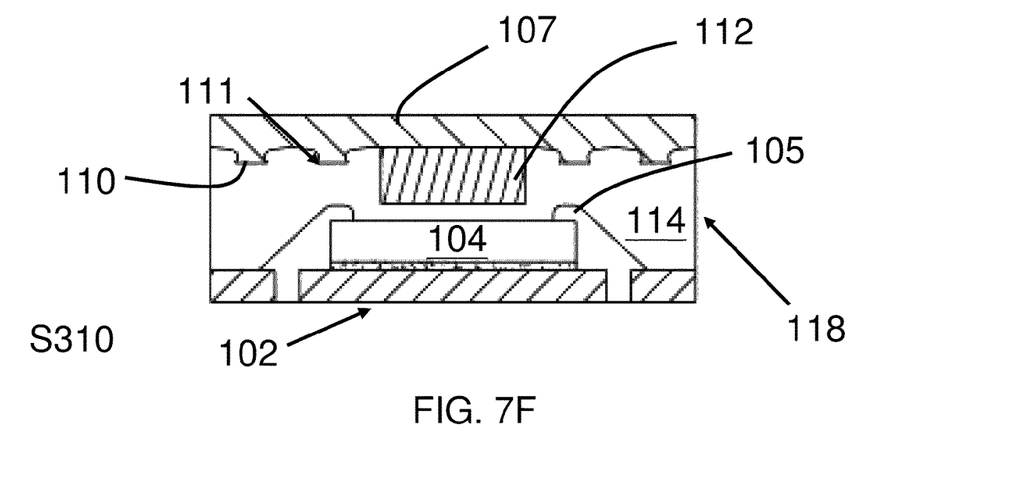

The IC package 118 as shown in FIG. 7F is described in more detail below. The leadframe 102 and the IC chip 104 is the same as described in FIG. 2C. The bottom surface of the leadframe 102 is exposed to the environment at a bottom side of the IC package 118. Above the leadframe 102 and the IC chip 104 is the encapsulation compound 114. The bottom side of the encapsulation compound 114 embeds the top surface of the leadframe 102 along with the top and side surfaces of the IC chip 104. The side surfaces of the encapsulation compound 114 are exposed to the environment at the side surfaces of the IC package 118. The top side of the encapsulation compound 114 embeds the bottom surface of the base sheet 107 and the bottom and side surfaces of the castellations 110, along with the bottom and side surfaces of the central castellation 112. The top surface of the base sheet 107 is exposed to the environment at a top side, and the side surfaces of the base sheet 107 are also exposed to the environment at the side surfaces of the IC package 118.

Figure 8A:
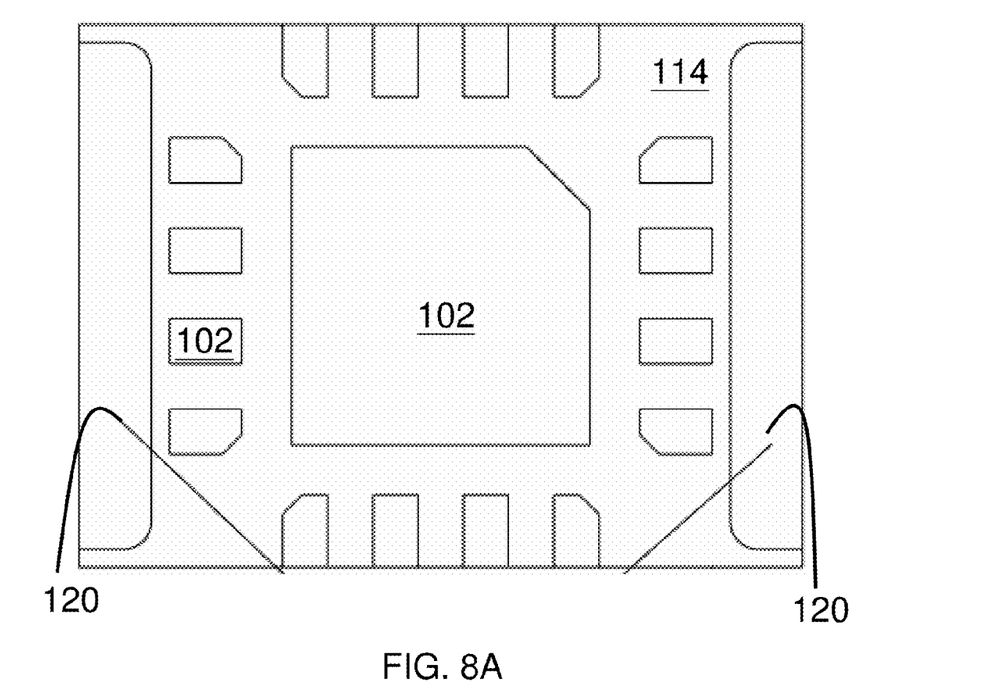
FIG. 8A is a bottom view of an IC package with metal clip according to an embodiment of the present invention.
Figure 8B:
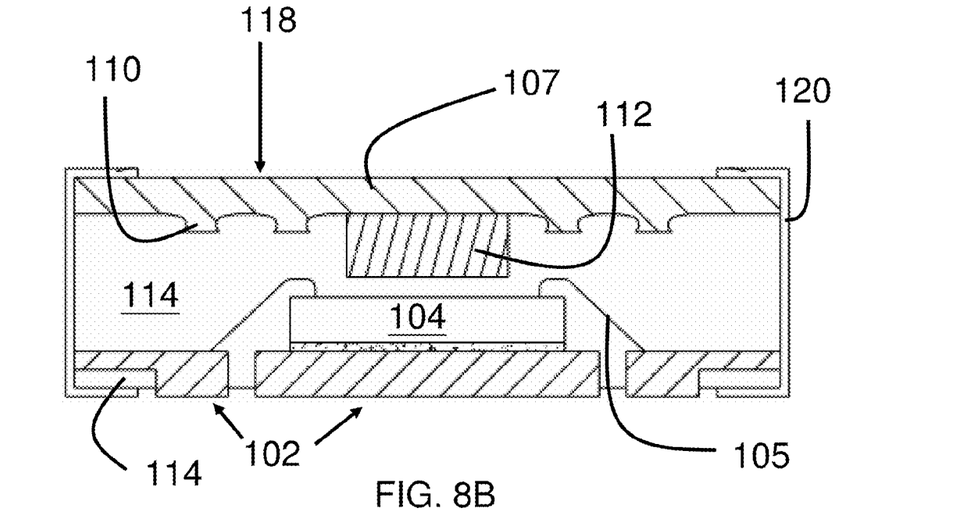
FIG. 8B is a horizontal cross sectional view of the IC package in FIG. 8A.

Referring now to FIGS. 8A and 8B, a bottom view and a side cross sectional view of a single IC package 118 is shown having a heatspreader 108 disposed over an IC chip 104 and having a metal clip 120 disposed on either side thereof. In various embodiments, the metal clip 120 is clamped around a top and bottom surface of the IC package 118. The top surface of the IC package 118 is also the top surface of the base sheet 107. As the metal clip 120 cannot make contact to the leadframe 102 or else it will create an electric short-circuit, the leadframe 102 is designed such that the encapsulation compound 114 covers the part of the bottom surface of the leadframe 102 that contacts the metal clip 120.

The metal clip 120 decreases the likelihood of separation between the heatspreader 106 and the leadframe 102. Additionally, the metal clip 120 increases the heat dissipation from the heatspreader 106 by thermally coupling the heatspreader 106 to a surface below the IC package 118 such as, for example, a PCB. In one embodiment, the metal clip 120 contacts the PCB when the leadframe 102 is bonded or soldered to the PCB. In another embodiment, the metal 120 is in close proximity to the PCB. The metal clip 120 also increases the surface area that heat can be dissipated from, so heat dissipation performance is further improved.

To produce the integrated circuit package as shown in FIGS. 8A and 8B, the metal clip 120 is attached to the individual IC package 118 after the singulation step S310.

Although various embodiments of the method and system of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth herein.

For example, the top surface of the base sheet 107 is flat or untextured in the embodiments described. However, it is obvious that the top surface can also be partially etched or otherwise plated with additional material to form a patterned surface to further increase the surface area of the heatspreader 106. In an embodiment, the mold follows the contour of the top surface of the base sheet 107 such that encapsulation compound 114 will not be injected between the upper mold half and the top surface of the base sheet 107.

The embodiments above described that the castellations can be formed by either etching and layering. It is clear to a person skilled in the art that both methods can be used in the same heatspreader if they so wish.

The IC package 118 as shown in FIG. 7F uses the embodiment of the heatspreader 106 as shown in FIGS. 6A-6C. However, it is clear that all embodiments of the heatspreader 106 shown above or with variations described in the paragraphs above can be used in the IC package 118.

The side surfaces of the castellations 110 are shown as concave in the embodiment, but it could be convex or having a sharp corner as long as the shape has a larger surface area than flat surface while improves interlocking.

What is claimed is:

1. An integrated circuit package comprising:
   a) a leadframe having a first surface and an opposing second surface;
   b) a semiconductor die having a first surface and an opposing second surface, said first surface of said semiconductor die mounted on said first surface of said leadframe;
   c) an encapsulation compound having a first side and an opposing second side, said first surface of said leadframe and said second surface of said semiconductor die embedded in said first side of said encapsulation compound;
   d) a heat sink disposed in proximity to said semiconductor die, said heat sink comprising:
      i) a base sheet having a first surface facing said semiconductor die and an opposing second surface;
      ii) at least one castellation extending from said first surface of said base sheet, said castellation having a first surface facing said semiconductor die and at least one second surface adjacent to said first surface of said castellation and said first surface of said base sheet;
   wherein said first surface of said base sheet, said first surface of said castellation and said at least one second surface of said castellation are embedded in said second side of said encapsulation compound, such that a layer of encapsulation compound separates said heat sink from said semiconductor die and said leadframe, said second surface of said leadframe exposed to the environment on one side and said second surface of said base sheet exposed to the environment on an opposing side; and
   wherein said at least one castellation further comprises an undercut at said at least one second surface of said castellation, such that a cross sectional area of said first surface of said castellation is larger than a cross sectional area along said second surface of said castellation.

2. The integrated circuit package according to claim 1, wherein said at least one castellation is integrally formed with said base sheet.

3. The integrated circuit package according to claim 1, wherein said at least one castellation is attached onto said first surface of said base sheet.

4. The integrated circuit package according to claim 1, wherein said at least one castellation comprises a central castellation surrounded by a plurality of peripheral castellations wherein a center of said central castellation is aligned to a center of said semiconductor die with a layer of encapsulation compound separating said central castellation from said semiconductor die.

5. The integrated circuit package according to claim 4, wherein said central castellation is integrally formed with said base sheet.

6. The integrated circuit package according to claim 4, wherein said central castellation is attached onto said first surface of said base sheet.

7. The integrated circuit package according to claim 4, wherein said central castellation comprises an undercut at said at least one second surface of said central castellation.

8. The integrated circuit package according to claim 1, further comprising a metal clip attached to at least one side of the integrated circuit package, said metal clip contacts said second surface of said base sheet and an encapsulation compound exposed to the environment at an opposing side to said second surface of said base sheet.

9. The integrated circuit package according to claim 8, wherein when said second surface of said leadframe is attached to a surface, said metal clip also contacts said surface.

10. The integrated circuit package according to claim 1, wherein said undercut of said castellation is generally concave shaped.

11. A method for fabricating an integrated circuit package according to claim 1, comprising the steps of:
 a) etching a leadframe strip to define said leadframe having said first surface and said second surface;
 b) attaching said semiconductor die having said first surface and said second surface to said leadframe by mounting said first surface of said semiconductor die on said first surface of said leadframe;
 c) fixing said leadframe strip and a heat sink strip to a mold, said heat sink strip having a first surface facing said semiconductor die and an opposing second surface, wherein said heat sink strip is disposed in close proximity to said semiconductor die and a cavity exists between said heat sink strip and said leadframe strip when fixed to said mold;
 d) encapsulating said cavity with said encapsulation compound, wherein said first surface of said leadframe strip, said second surface of said semiconductor die, and said first surface of said heat sink strip are embedded in said encapsulation compound, such that a layer of said encapsulation compound separates said heat sink strip from said semiconductor die and said leadframe strip;
 e) singulating said integrated circuit package from said leadframe, said heat sink strip and said encapsulation compound.

12. The method according to claim 11, wherein said heat sink strip comprises at least one said heat sink, the method further comprising the step of etching said first surface of said heat sink strip to define at least one said castellation extending from said first surface of said heat sink strip.

13. The method according to claim 12, wherein said etching step produces an undercut in at least one surface of said castellation.

14. The method according to claim 11, wherein said heat sink strip comprises at least one said heat sink, the method further comprising the step of attaching at least one said castellation on said first surface of said heat sink strip.

15. The method according to claim 11, further comprising the step of etching said first surface of said heat sink strip to define a central castellation extending from said first surface of said heat sink strip, a center of said central castellation aligned to a center of said semiconductor die.

16. The method according to claim 15, wherein said etching step produces an undercut in at least one surface of said central castellation.

17. The method according to claim 11, further comprising the step of attaching a central castellation on said first surface of said heat sink strip.

18. The method according to claim 11, further comprising attaching a metal clip to at least one side of said integrated circuit package, said metal clip contacts said second surface of said heat sink strip and a surface of said integrated circuit package opposing said second surface of said heat sink strip.

* * * * *